United States Patent
Bösnecker

(10) Patent No.: US 7,930,119 B2
(45) Date of Patent: Apr. 19, 2011

(54) METHOD FOR ANALYZING AC VOLTAGE SIGNALS

(75) Inventor: Robert Bösnecker, Ergolding (DE)

(73) Assignee: Siemens Aktiengesellschaft, München (DE)

( * ) Notice: Subject to any disclaimer, the term of this patent is extended or adjusted under 35 U.S.C. 154(b) by 476 days.

(21) Appl. No.: 11/970,835

(22) Filed: Jan. 8, 2008

(65) Prior Publication Data
US 2009/0125261 A1 May 14, 2009

(30) Foreign Application Priority Data
Nov. 8, 2007 (DE) .................. 10 2007 054 306

(51) Int. Cl.
*G01R 23/16* (2006.01)
*G06F 17/40* (2006.01)

(52) U.S. Cl. ............... 702/64; 702/75; 702/76; 702/77; 324/76.38; 324/76.39; 324/76.19; 324/76.21

(58) Field of Classification Search ............ 702/64, 702/75–77
See application file for complete search history.

(56) References Cited

U.S. PATENT DOCUMENTS

| | | | | |
|---|---|---|---|---|
| 4,319,329 A * | 3/1982 | Girgis et al. | .................... | 702/75 |
| 5,321,350 A * | 6/1994 | Haas | .......................... | 324/76.11 |
| 5,487,016 A * | 1/1996 | Elms | ............................. | 702/71 |
| 5,528,134 A * | 6/1996 | Davis et al. | ................ | 324/76.24 |
| 5,600,527 A * | 2/1997 | Engel et al. | ................... | 361/93.2 |
| 5,995,914 A * | 11/1999 | Cabot | ............................ | 702/109 |
| 6,128,584 A * | 10/2000 | Hemminger et al. | ........... | 702/75 |
| 2008/0033695 A1* | 2/2008 | Sahara et al. | .................. | 702/185 |

OTHER PUBLICATIONS

Schoukens, J. et al.: Fully Automated Spectral Analysis of Periodic Signals . In: IEEE Transactions on Instrumentation and Measurement, vol. 52, No. 4, Aug. 2003; pp. 1021-1024.

\* cited by examiner

*Primary Examiner* — Hal D Wachsman
(74) *Attorney, Agent, or Firm* — Henry M. Feiereisen; Ursula B. Day

(57) ABSTRACT

A method is disclosed for analyzing an AC voltage signal with a transformation which transforms the signal from a representation in the time-domain to a representation in the frequency-domain. This transformation can be a fast Fourier transform, a discrete Fourier transform or a Laplace transform. By selecting a second higher sampling frequency which is an integer multiple of a first sampling frequency, the zero crossings of the AC voltage signal can be accurately determined.

5 Claims, 2 Drawing Sheets

METHOD FOR ANALYZING AC VOLTAGE SIGNALS

CROSS-REFERENCES TO RELATED APPLICATIONS

This application claims the priority of German Patent Application, Serial No. 10 2007 054 306.0, filed Nov. 8, 2007, pursuant to 35 U.S.C. 119(a)-(d), the content of which is incorporated herein by reference in its entirety as if fully set forth herein.

BACKGROUND OF THE INVENTION

The present invention relates to a method for analyzing AC voltage signals. More particularly, the present invention is directed to a frequency analysis using a transformation method, such as the Fast Fourier Transform (FFT).

To perform a Fast Fourier transform, a standard method is typically used to determine a sampling frequency, wherein the sampling frequency of the standard method (standard sampling frequency) determines the number of sampling values for a predetermined overall sampling duration. A fundamental frequency $f_0$ is defined for the analysis, and a spectral analysis is performed based on this fundamental frequency and its harmonics. If the analysis is to be performed up to the $n^{th}$ harmonic, then the standard sampling frequency f extends to $f=2nf_0$. The factor 2 stems from the Shannon theorem. In conventional methods, all sampling values are used, whereby care is taken that the sampling values provide the most optimal representation of the curve shape. More particularly, the zero crossings of the input signals must be accurately reproduced by the sampling values. Larger errors occur if two sampling values are located next to a zero crossing and the zero crossing does not coincide with any of the sampling values. Several techniques according to the state of the art have been developed to ensure that these sampling values will coincide as closely as possible with a zero crossing. This requires a complex apparatus.

It would therefore be desirable and advantageous to provide an improved method for accurately representing an AC voltage signal, which obviates prior art shortcomings and is able to specifically sample an AC signal from a power grid using a less complex apparatus and with lower error rate.

SUMMARY OF THE INVENTION

According to one aspect of the present invention, a method for analyzing an AC voltage signal includes the steps of defining a fundamental frequency $f_0$ to be used to analyze an input signal, defining a natural number n which indicates that the input signal is to be analyzed up to the $n^{th}$ harmonic of the fundamental frequency $f_0$, computing a standard sampling frequency $f=2nf_0$, sampling the input signal with a sampling frequency $f_{sampling}>f$ to obtain sampling values, and using only a portion of the sampling values for a transformation method.

The present invention resolves prior art problems by the observation that when there is redundancy during sampling, the most suitable values for a transformation from the time domain into the frequency domain (e.g., by a fast Fourier analysis) are always included in the set of the sampling values. The input signal is sampled with a sampling frequency $f_{sampling}$ which is greater than the accurately determined standard sampling frequency f. Depending on the ratio $f_{sampling}/f$, a suitable method can be found to determine which sampling values will be selected for the transformation method.

According to another feature of the present invention, the sampling frequency $f_{sampling}$ may be an integer multiple of the standard sampling frequency, $f_{sampling}=mf=m2nf_0$. After sampling, a predetermined sampling value can be selected which is most appropriate for the transformation, with every $m^{th}$ sampling value in the sequence of sampling values before and after the predetermined sampling value being used for the fast Fourier transform. For example, a sampling value can be selected which is closest to a zero crossing of the AC voltage signal. By selecting the m-fold standard sampling frequency as the new sampling frequency, it becomes more likely that a sampling value is very close to the zero crossing or even coincides with the zero crossing. If the employed sampling values are defined as a function of the selected sampling value, then these are optimally suited for a particular precise analysis of the input signal.

According to another aspect of the invention, a device for sampling and AC voltage signal (in particular from the power grid) is provided, which is configured to define a fundamental frequency $f_0$ to be used to analyze the input signal by sampling a predetermined quantity of sampling values, to define a natural number n which indicates that the input signal is to be analyzed up to the $n^{th}$ harmonic of the fundamental frequency $f_0$, to compute a standard sampling frequency $f=2nf_0$, to sample the input signal with a sampling frequency $f_{sampling}>f$ to obtain sampling values, and to only use a portion of these sampling values for the transformation method. In one embodiment of the device of the invention, the device is configured to determine from the predetermined quantity of sampling values a sampling value according to predetermined criteria and to select the remaining sampling values depending on that sampling value. The predetermined criteria are preferably criteria which define a zero crossing of the input signal or sampling values.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
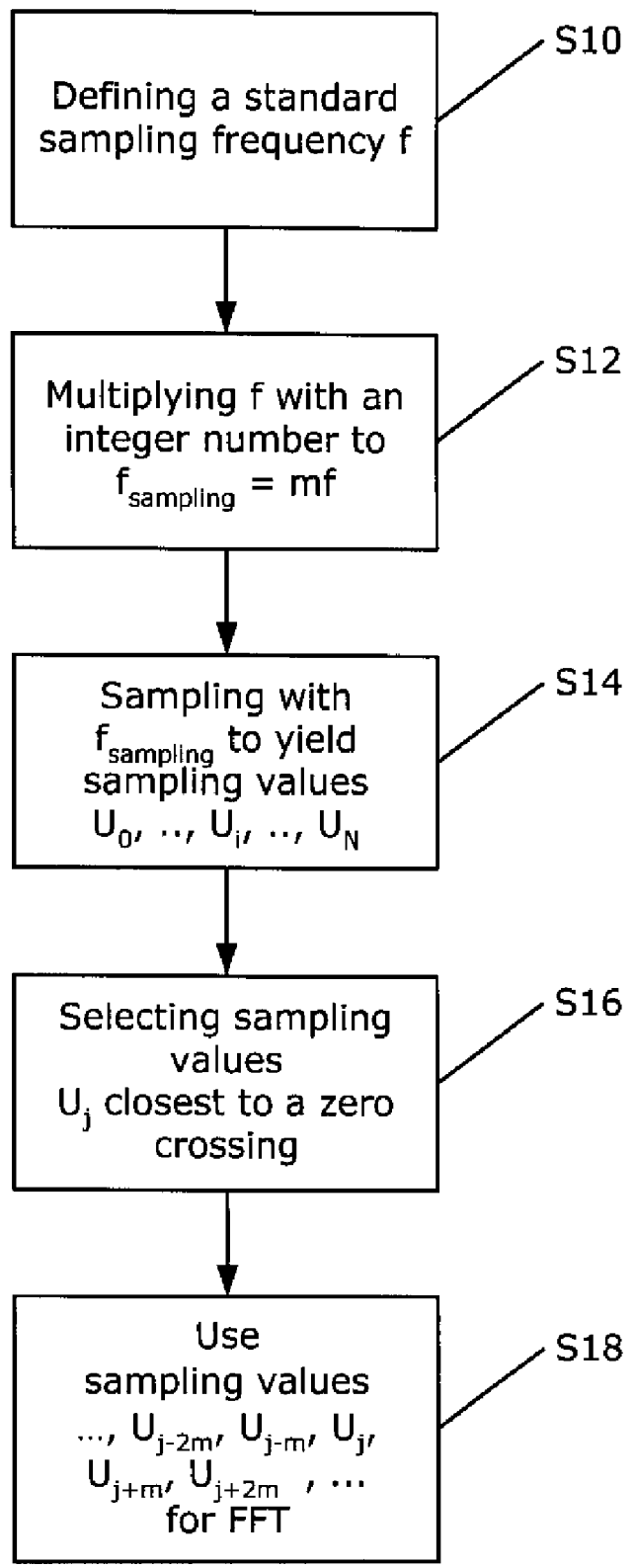
FIG. 1 is a flowchart, showing schematically the process steps for carrying out the method according to the present invention.

Turning now to FIG. 1, there is shown a process flow of a method for analyzing an AC voltage signal according to the invention. At a first step S10 of the method of the invention, a standard sampling frequency f is defined. This standard sampling frequency represents a frequency which is typically used for performing a fast Fourier transform (FFT). This standard sampling frequency $f=2nf_0$ is derived from the fundamental frequency $f_0$ to be used for the analysis, if the analysis is to be performed up to the $n^{th}$ harmonic.

At the next step S12, the standard sampling frequency is multiplied with an integer number m to yield $f_{sampling}=mf$.

The method then samples over a period of the fundamental frequency with a frequency $f_{sampling}$ to provide sampling values $U_0, U_1, \ldots U_i, \ldots U_N$. (Step S14).

The sampling value $U_j$ which is closest to a zero crossing of the input signal is selected from the sampling values (step S16).

With $U_j$ being selected, each $m^{th}$ sampling value of the sequence of sampling values before and after the selected sampling value $U_j$ is used (i.e., ... $U_{j-2m}$, $U_{j-m}$, $U_j$, $U_{j+m}$, $U_{j+2m}$ ... ) for a fast Fourier transform, at step S18.

By using a sampling frequency $f_{sampling}$ which is greater than the standard sampling frequency f, the input signal is much more densely captured by the sampling values. However, having the entirety of the sampling values is not required for the fast Fourier transform. Advantage is taken of the density of the sampling values so as to select, if possible, such sampling value which is particularly appropriate for the fast Fourier transform (sampling value close to the zero crossing). The other sampling values are then derived according to the selected sampling value.

The invention can also be used with transformations other than a fast Fourier transform, which transforms from a representation in the time-domain to another type of representation, such as a representation in the frequency-domain. Another transformation method is, for example, the conventional Fourier transform (discrete Fourier transform, DFT) or the Laplace transform.

Figure 2:
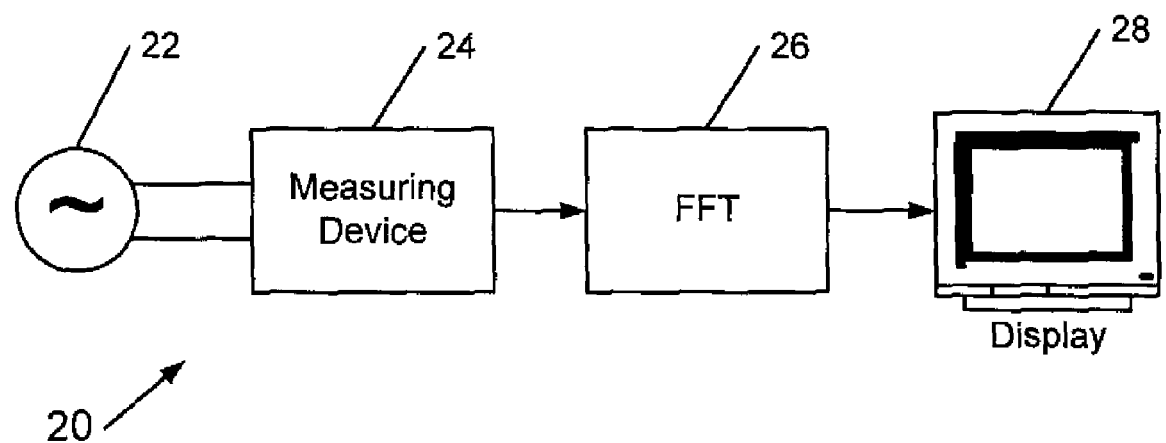
FIG. 2 is a schematic block diagram of a device for carrying out the method according to the present invention.

FIG. 2 depicts schematically in form of a block diagram a device 20 for carrying out the method of the invention. An AC voltage 22, for example, the AC voltage of a power grid, is measured by measuring device 24 which measures a time-dependence of the AC voltage 22. The time-dependent signal is supplied to a device 26 adapted to transform the time-dependent signal into the frequency domain, in the depicted example by a fast Fourier transform (FFT). The device 26 also selects and computes the sampling values used with the method of the invention. The resulting spectrum in the frequency domain can then be displayed on monitor 28.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed is:

1. A method for harmonic analysis of an AC voltage signal having a fundamental frequency $f_0$ and harmonic content, comprising the steps of:
   defining a natural number n which indicates that the AC voltage signal is to be analyzed up to an $n^{th}$ harmonic of the fundamental frequency $f_0$,
   computing from the fundamental frequency $f_0$ a first sampling frequency $f=2nf_0$,
   multiplying the first sampling frequency f with a natural number m to obtain a second sampling frequency $f_{sampling}=mf=m2nf_0$ which is higher than the first sampling frequency f,
   sampling the input AC voltage signal with the second sampling frequency $f_{sampling}$ to obtain a sequence of first sampling values,
   selecting from the sequence of first sampling values a second sampling value that is proximate to a zero-crossing of the AC voltage signal,
   performing the harmonic analysis of the AC voltage signal by using the second sampling value and in addition only each $m^{th}$ sampling value in the sequence of first sampling values before and after the second sampling value, and
   determining the harmonic content of the AC voltage signal.

2. The method of claim 1, wherein the selected second sampling value is closest to a zero crossing of the AC voltage signal.

3. The method of claim 1, wherein the transformation method is selected from the group consisting of fast Fourier transform, discrete Fourier transform, and Laplace transform.

4. A device for harmonic analysis of an AC voltage signal having a fundamental frequency $f_0$ and harmonic content and being supplied as an input signal to an input of the device, the device comprising:
   means for defining a natural number n which indicates that the AC voltage signal is to be analyzed up to an $n^{th}$ harmonic of the fundamental frequency $f_0$;
   means for computing from the fundamental frequency $f_0$ a first sampling frequency $f=2nf_0$;
   means for multiplying the first sampling frequency f with a natural number m to obtain a second sampling frequency $f_{sampling}=mf=m2nf_0$ which is higher than the first sampling frequency f,
   means for sampling the AC voltage signal with the second sampling frequency $f_{sampling}$ to obtain a sequence of first sampling values;
   means for selecting from the sequence of first sampling values a second sampling value that is proximate to a zero-crossing of the AC voltage signal,
   means for performing the harmonic analysis of the AC voltage signal by using the second sampling value and in addition only each $m^{th}$ sampling value in the sequence of first sampling values before and after the second sampling value, and
   means for determining the harmonic content of the AC voltage signal.

5. A device for performing a harmonic analysis of an AC voltage signal having a fundamental frequency $f_0$ and harmonic content, comprising:
   a measuring device receiving the AC voltage signal and sampling the AC voltage signal in a time domain,
   a conversion device which receives the sampled AC voltage signal and is configured to determine a natural number n which indicates that the AC voltage signal is to be analyzed up to an $n^{th}$ harmonic of the fundamental frequency $f_0$; to compute from the fundamental frequency $f_0$ a first sampling frequency $f=2nf_0$; to multiply the first sampling frequency f with a natural number m to obtain a second sampling frequency $f_{sampling}=mf=m2nf_0$ which is higher than the first sampling frequency f; to sample the AC voltage signal with the second sampling frequency $f_{sampling}$ to obtain a sequence of first sampling values; to select from the sequence of first sampling values a second sampling value that is proximate to a zero-crossing of the AC voltage signal; and to perform the harmonic analysis of the AC voltage signal by using the second sampling value and in addition only each $m^{th}$ sampling value in the sequence of sampling values before and after the sampling value; and
   a display device for displaying the harmonic content of the AC voltage signal.

* * * * *

UNITED STATES PATENT AND TRADEMARK OFFICE
CERTIFICATE OF CORRECTION

PATENT NO. : 7,930,119 B2
APPLICATION NO. : 11/970835
DATED : April 19, 2011
INVENTOR(S) : Robert Bösnecker Page 1 of 1

It is certified that error appears in the above-identified patent and that said Letters Patent is hereby corrected as shown below:

Column 3, claim 1, line 62: before "AC" delete "input".

Signed and Sealed this
Thirty-first Day of May, 2011

David J. Kappos
*Director of the United States Patent and Trademark Office*